United States Patent
Krueger et al.

(10) Patent No.: US 7,518,249 B2
(45) Date of Patent: Apr. 14, 2009

(54) ELECTRIC COMPONENT WITH A FLIP-CHIP CONSTRUCTION

(75) Inventors: Hans Krueger, Munich (DE); Karl Nicolaus, Munich (DE); Juergen Portmann, Munich (DE); Peter Selmeier, Maitenbeth (DE)

(73) Assignee: EPCOS AG, Munich (DE)

( * ) Notice: Subject to any disclaimer, the term of this patent is extended or adjusted under 35 U.S.C. 154(b) by 19 days.

(21) Appl. No.: 11/659,146

(22) PCT Filed: Jun. 8, 2005

(86) PCT No.: PCT/EP2005/006165
§ 371 (c)(1),
(2), (4) Date: Jun. 12, 2007

(87) PCT Pub. No.: WO2006/015642
PCT Pub. Date: Feb. 16, 2006

(65) Prior Publication Data
US 2008/0048317 A1 Feb. 28, 2008

(30) Foreign Application Priority Data
Aug. 4, 2004 (DE) .................... 10 2004 037 817

(51) Int. Cl.
*H01L 23/48* (2006.01)
*H01L 23/52* (2006.01)
(52) U.S. Cl. .................. 257/778; 257/738; 257/747; 257/780
(58) Field of Classification Search .......... 257/738, 257/778, 780, 786, 747
See application file for complete search history.

(56) References Cited

U.S. PATENT DOCUMENTS

2002/0180307 A1* 12/2002 Taga .................. 310/313 R
2004/0094842 A1   5/2004 Jimarez et al.

FOREIGN PATENT DOCUMENTS

EP    1 333 494         8/2003
WO    WO00/70671       11/2000

OTHER PUBLICATIONS

International Search Report for PCT/EP2005/006165.
Written Opinion for PCT/EP2005/006165.
English translation of Written Opinion for PCT/EP2005/006165.

* cited by examiner

*Primary Examiner*—Hung Vu
(74) *Attorney, Agent, or Firm*—Fish & Richardson P.C.

(57) ABSTRACT

A component includes a carrier substrate having a coefficient of thermal expansion $\alpha_p$ and a chip mounted on the carrier substrate by a plurality of bumps. The chip has a first coefficient of thermal expansion $\alpha_1$ in a first direction $x_1$ and a first expansion difference, $\Delta\alpha_1$ equal to the absolute value of $\alpha_p - \alpha_1$. The chip also has a second coefficient of thermal expansion $\alpha_2$ in a second direction $x_2$ and a second expansion difference $\Delta\alpha_2$ is equal to the absolute value of $\alpha_p - \alpha_2$. The bumps are arranged such that a first distance, $\Delta x_1$, corresponding to a normal projection of a line between centers of terminally situated bumps in the first direction onto an axis running parallel to direction $x_1$ is less than a second distance corresponding to a normal projection of a line between centers of terminally situated bumps in the second direction onto an axis parallel to direction $x_2$.

20 Claims, 7 Drawing Sheets

ELECTRIC COMPONENT WITH A FLIP-CHIP CONSTRUCTION

FIELD OF THE INVENTION

An electrical component with a chip that is mounted on a carrier substrate in a flip chip arrangement is disclosed.

BACKGROUND

The chip plane equipped with component structures can have coefficients of thermal expansion $\alpha_1$, $\alpha_2$ differing from one another in different directions, depending on the crystal axes. This is particularly the case for surface acoustic wave chips with a piezoelectric substrate whose physical properties exhibit anisotropy. The coefficients of thermal expansion $\alpha_1$, $\alpha_2$, are generally larger than the coefficient of thermal expansion $\alpha_p$ of the underlying carrier substrate. In case of a change in temperature, the change in length of the chip is greater than that of the carrier substrate.

The chip is mechanically fixed to the carrier substrate by means of solder joints (bumps). These solder joints are therefore subject to mechanical stresses that arise due to the difference $\Delta\alpha_1=|\alpha_p-\alpha_1|$ and $\Delta\alpha_2=|\alpha_p-\alpha_2|$ in the coefficients of thermal expansion of the chip and the carrier substrate. In case of differing coefficients of thermal expansion of the chip and the carrier substrate, the outermost bumps and the carrier substrate, in particular, are subject to the strongest stresses form the shearing force $F(F_1, F_2)$ acting on them. $F_1$ is the force component in the first preferred direction $x_1$. $F_2$ is the force component in the second preferred direction $x_2$.

SUMMARY

In some embodiments, an electrical component is formed with a flip chip arrangement in which the smallest shearing forces possible act on the outermost bumps.

The distance between the centers of the terminal bumps in the, direction $x_1$ is $L_1$ at a first temperature $T_1$ and $L_2$ at a second temperature $T_2$. The linear thermal expansion $\Delta L=|L_1-L_2|$ of the chip area in direction x1 defined by the terminal bumps is $\Delta L=\alpha_1 L_1 \Delta T$, where $\Delta T=|T_1-T_2|$. A shearing force component $F_1$ that is proportional to $\Delta L$ arises in this direction. In some embodiments, it is sought to keep the shearing force component $F_1$ as low as possible. Taking into account the given coefficients of thermal expansion, a bump arrangement is sought in which the distance between the terminal bumps in the direction of the maximum expansion difference is smaller than the distance between the terminal bumps in the direction of minimum expansion difference.

An electrical component with a carrier substrate and a chip that is mounted on the carrier substrate with a flip-chip arrangement is disclosed. The carrier substrate has a coefficient of thermal expansion $\alpha_p$. The chip has a coefficient of thermal expansion $\alpha_1$ in a first preferred direction $x_1$, where $\Delta\alpha_1=|\alpha_p-\alpha_1|$ is the first expansion difference. In a second preferred direction $x_2$, the chip has a second coefficient of thermal expansion $\alpha_2$, where $\alpha_2=|\alpha_p-\alpha_2|$ is the second expansion difference.

The distance between the orthogonal projections of the bump centers of the terminal bumps in direction $x_1$ onto the $x_1$ axis is $\Delta x_1$. The distance between the orthogonal projections of the bump centers of the terminal bumps in direction $x_2$ onto the $x_2$ axis is $\Delta x_2$. Here we have $\Delta x_1 < \Delta x_2$ for $\Delta\alpha_1 > \Delta\alpha_2$ and $\Delta x_1 > \Delta x_2$ for $\Delta\alpha_1 < \Delta\alpha_2$. With such a bump arrangement, the shearing force arising from temperature changes and acting on the terminal bumps can be successfully minimized.

First preferred direction $x_1$ is preferably defined to be the direction in which the component has the largest expansion difference, $\Delta\alpha_1$. Second preferred direction $x_2$ is preferably defined to be the direction in which the component has the lowest expansion difference, $\Delta\alpha_2$.

Distances $\Delta x_1$, $\Delta x_2$ are preferably selected relative to one another such that the components $F_1$, $F_2$ of shearing force F are substantially equal to one another.

Axes $x_1$, $x_2$ define a coordinate system $\{x_1,x_2\}$, which corresponds to a two-dimensional space, on the surface of which the chips are arranged.

Axes x and y are oriented along the along the intersecting chip edges. The chip edges are preferably rectangular in form, i.e., the first and second chip edges are perpendicular to one another. In case of chip edges running parallel to one another, axes x, y define a rectangular coordinate system $\{x, y\}$. The first chip edge is oriented, for instance, along the x axis and the second chip edge along the y axis.

In general, axes x, y, $x_1$ and $x_2$ can be oriented at an arbitrary angle relative to one another. In one variant, at least one of axes $x_1$, $x_2$ can run parallel to axis x or y, but that is not a necessary condition. The coordinate system $\{x_1, x_2\}$ can coincide with coordinate system $\{x, y\}$. The (possibly rectangular) coordinate system. $\{x_1, x_2\}$ can be rotated by an angle β2>0 relative to coordinate system $\{x, y\}$; see FIG. 11. In one variant, coordinate system $\{x_1, x_2\}$ can be obliquely angular, where angle β1 between axes $x_1$ and $x_2$ differs from 90° (see FIG. 12).

It is advantageous to arrange bump rows on the bottom side of the chip parallel to the respective chip edge. In one variant, several bumps can be arranged on a line parallel to a first chip edge (in direction x) and/or parallel to the second chip edge (in direction y). The bumps can also be arranged in a row that is preferably situated centrally on the lower surface of the chip. The bumps can also be arranged along the four chip edges in a peripheral area of the chip around the chip edges.

The bump rows are preferably arranged along direction $x_1$ of the maximal expansion difference. The distance between the bumps situated terminally in direction $x_1$ or optionally in the same row, is preferably smaller than the distance between the bump rows in which the terminally situated bumps in direction $x_2$ are situated.

In one variant, several bumps can be arranged on a line along first preferred direction $x_1$ and/or along second preferred direction $x_2$.

In one variant, all bumps are arranged in two rows parallel to direction $x_2$ of minimal expansion difference. The distance between these rows is $\Delta x_1$. Distance $\Delta x_1$ is smaller in this case than the length of the row (measured between the centers of the terminal bumps of the row). The length of the chip edges can be adapted to the bump arrangement in such a manner that the mutually parallel-oriented rows are arranged in the edge areas of the chip. The terminal bumps of the chip are preferably turned toward the corners of the chip surface here. In this case, the first chip edge (in direction $x_1$) is shorter than the second chip edge (in direction $x_2$).

The lower surface of the chip can be subdivided in at least one direction x, y (or $x_1$, $x_2$) into wide peripheral areas and a central area, with the width of the respective peripheral area preferably exceeding or twice the cross-sectional size of bump. The bumps in this variant are arranged only in the central area. The wide peripheral areas have no bumps.

As a rule, the coefficient of thermal expansion $\alpha_p$ of the carrier substrate is less than $\alpha_1$ and/or $\alpha_2$. The coefficient of thermal expansion of the basic material of the carrier substrate can also be modified, more particularly, raised, within certain limits by, for instance, the addition of an additive or filler, and thereby be adapted to the coefficient of thermal expansion $\alpha_1$ and/or $\alpha_2$. Thus one obtains expansion differences $\Delta\alpha_1$ and/or $\Delta\alpha_2$ that are as small as possible. It is possible, for instance, to select the material of the carrier substrate such that $\alpha_p = \alpha_1$ or $\alpha_p = \alpha_2$, i.e., $\Delta\alpha_1 = 0$ or $\Delta\alpha_2 = 0$.

In some embodiments, for example, it can be the case that $\Delta\alpha_2 = 0$, $\Delta\alpha_1 > 0$. In this case it is advantageous to arrange the bumps in a row along the second preferred direction $x_2$, so that $\Delta x_1 = 0$.

A bump row is understood to be an arrangement of the bumps along one direction in which the bump centers of the bumps arranged in a row lie on a line in this direction.

In relation to direction $x_1$, the bump row is preferably arranged centrally on the lower surface of the chip. In case the bumps are arranged in only one row, the chip can then be stabilized relative to the carrier substrate in the $x_1$ direction such that the lower surface of the chip runs substantially parallel to the surface of the carrier substrate. Spacers that are preferably arranged between the chip and the carrier substrate along first preferred direction $x_1$ in the peripheral areas of the chip can be provided.

In another variant, the material of the carrier substrate can be selected such that coefficient $\alpha_p$ lies between $\alpha_1$ and $\alpha_2$. Here it can be the case that $\alpha_1 > \alpha_2$ or that $\alpha_1 < \alpha_2$. Coefficient $\alpha_p$ is preferably matched to a lower coefficient of thermal expansion, where $\alpha_p = \min\{\alpha_1, \alpha_2\}$. Coefficient $\alpha_p$ can also be matched to the larger coefficient of thermal expansion, where $\alpha_p = \max\{\alpha_1, \alpha_2\}$.

The bumps (not necessarily the terminal bumps) are preferably arranged on the bottom side of the chip such that the larger bump spacings lie in the direction of the lowest expansion difference, $\alpha_{min} = \min\{\alpha_1, \alpha_2\}$. The bump height and diameter is preferably small, for instance, <100 μm or <50 μm.

On the lower chip surface and the upper side of the carrier substrate, contact surfaces firmly joined to the bumps (UBM=under bump metallization) are provided. In some embodiments, larger contact surfaces are provided for terminal bumps that are more severely stressed during temperature changes than for the remaining bumps, which are less stressed. This variant has the advantage that the surface area of the chip's bottom side that is covered by the centrally arranged bumps can be kept small.

The component structures are preferably arranged on the chip's bottom side. It is also possible, however, to arrange the component structures at least in part in the interior of the chip.

The invention will be explained in detail below on the basis of embodiments and the associated figures. The figures show various embodiments of the invention on the basis of schematic representations not drawn to scale. Identical or identically functioning parts are labeled with the same reference numbers. Shown schematically are.

DESCRIPTION OF THE DRAWINGS

DETAILED DESCRIPTION

Figure 1:
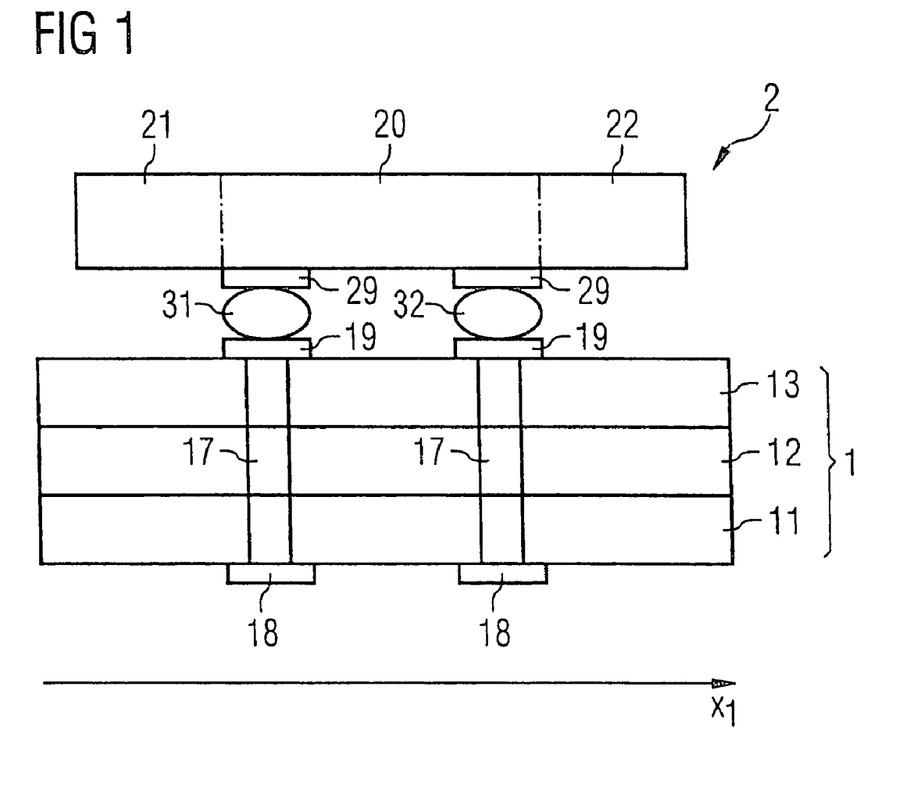
FIG. 1, the component with a chip mounted on the carrier substrate with a flip-chip construction, in a schematic cross section.

FIG. 1 shows the schematic cross section of the component, a carrier substrate 1 and a chip 2 mounted thereon via bumps 31, 32. Arranged on its lower surface, the chip has, for instance, component structures operating with acoustic waves. The arrangement, for the sake of example, of component structures operating with surface acoustic waves on the underside of the chip is shown in FIGS. 4-7.

FIGS. 4-7 each show a filter that has two acoustic tracks. The first (upper) and the second (lower) acoustic track have several transducers 711, 712, 713 and 721, 722, 723, respectively. Transducer 711 arranged in the first acoustic track serves as the input transducer and transducer 721 arranged in the second acoustic track serves as the output transducer of the filter. Transducers 712, 713, 722 and 723 are coupling transducers for input or output coupling of the electrical signal from one track to another.

Input transducer 711 is connected to an input port, and output transducer 721 is connected to an output port. The electrical terminals of the input transducer (or the output transducer) are arranged in FIGS. 4 and 5 on different sides of the respective acoustic track. Input transducer 711 (or output transducer 721) is connected in FIG. 4 via feed lines to a terminally situated bump 31 (or 32, respectively) and an additional bump arranged centered between the two tracks. Input transducer 711 (or output transducer 721) is connected in FIG. 5 to a terminally-arranged bump 34 (or 31, respectively) and an additional bump arranged centered between the two tracks.

Figure 4:
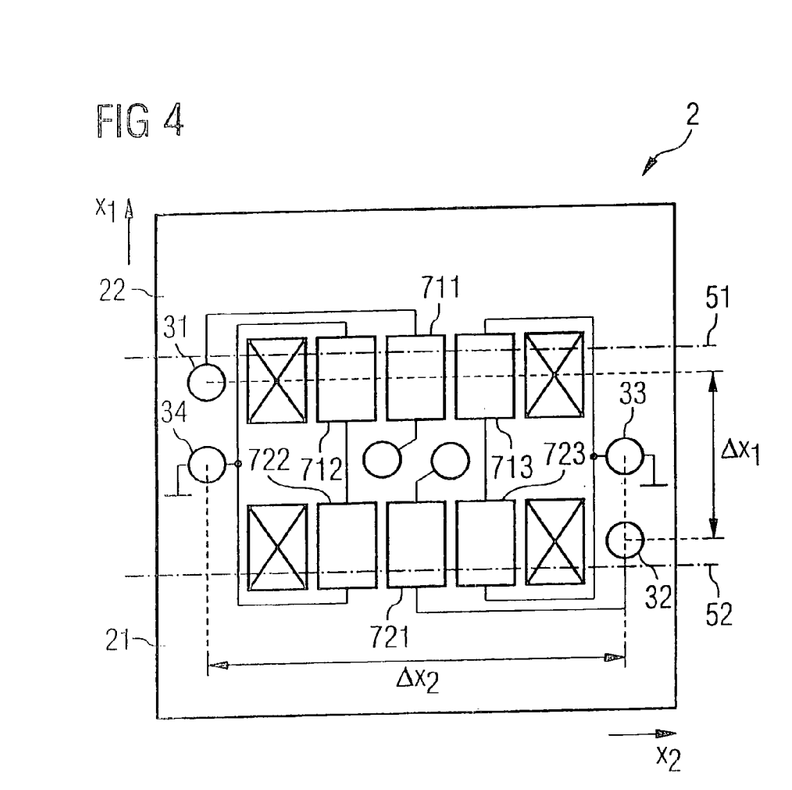
FIGS. 4, 5, 6, 7, the plan view, in each case, of the lower surface of a chip with bump arrangement, active component structures and with wide peripheral areas along the first preferred direction.
Figure 5:
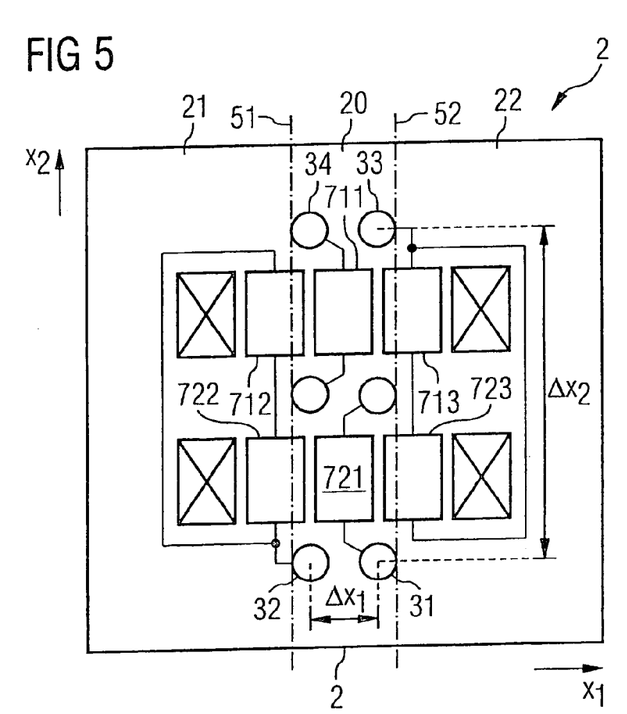

The coupling transducers 712 and 722, 713 and 723 of different tracks are electrically connected to one another and to a ground bump (to a terminally-arranged bump 33 or 34 in FIG. 4; to a terminally-arranged bump 32 or 33 in FIG. 5).

Figure 6:
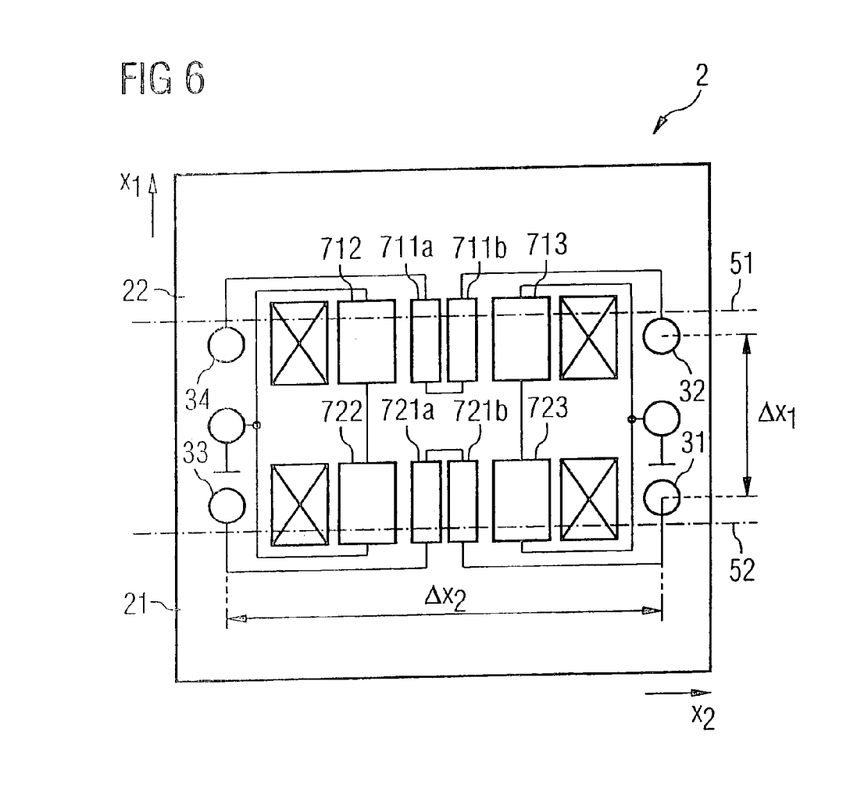
Figure 7:
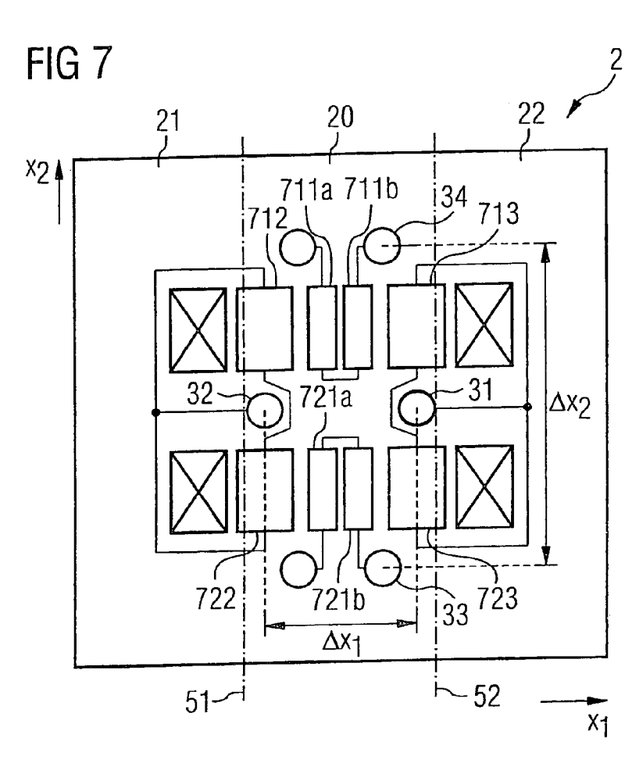

In FIGS. 6 and 7, input and output transducers 711, 721 are subdivided into two component transducers 711a and 711b, 721a and 721b, respectively, that are electrically connected to one another in series. The bumps connected to the input and output port are arranged in the outer bump rows.

The ground bumps connected to the coupling transducers are arranged in the outer bump rows in FIG. 6. The ground bumps connected to the coupling transducers are arranged between the acoustic tracks in FIG. 7.

In the variant presented in FIG. 6, the bumps connected to the input port are arranged in different bump rows to the left and right of the acoustic tracks that are oriented along the $x_1$ axis. The same also applies to the bumps connected to the output port.

The bump rows are thus oriented along the direction of maximum expansion difference. The distance $x_1$ between the terminally situated bumps in the same row (31 and 32, 33 and 34) is smaller than the distance between the bump rows which contain the bumps situated terminally in the $x_2$ direction.

In the variant presented in FIG. 7, the bumps connected to the input port are arranged in a first bump row oriented along the $x_1$ axis and lying above the first acoustic track in the figure. Ground bumps 31, 32 connected to the coupling transducers are oriented along a second bump row oriented along the $x_1$ axis and lying between the two acoustic tracks in the figure. The bumps connected to the output port are arranged in a third bump row oriented along the $x_1$ axis and lying below the second acoustic track in the figure. Here, too, the distance between bumps 31 and 32 that are terminally situated (in the $x_1$ direction) is less than the distance between the bump rows in which bumps 33 and 34 that are situated terminally (in the $x_2$ direction) are situated.

Carrier substrate 1 shown in FIG. 1 has several dielectric layers 11, 12, 13, between which structured metal layers (not shown here) with hidden component structures are arranged. The metal layers are electrically connected via through hole contacts 17 to one another as well as to external contacts 18 of the component that are arranged on the bottom side of carrier substrate 1 and to contact surfaces 19 of the carrier substrate that are arranged on the upper side of carrier substrate 1.

The chip preferably has component structures operating with surface acoustic waves that are arranged on the lower surface of the chip, but are not shown in the figure. Chip 2 has contact surfaces 29 that are electrically connected to contact surfaces 19 of the carrier substrate by means of bumps 31, 32. The lower chip surface is subdivided in first preferred direction $x_1$ into a central area 20, in which bumps 31, 32 are arranged, and peripheral areas 21, 22 (without bumps).

Figure 2:
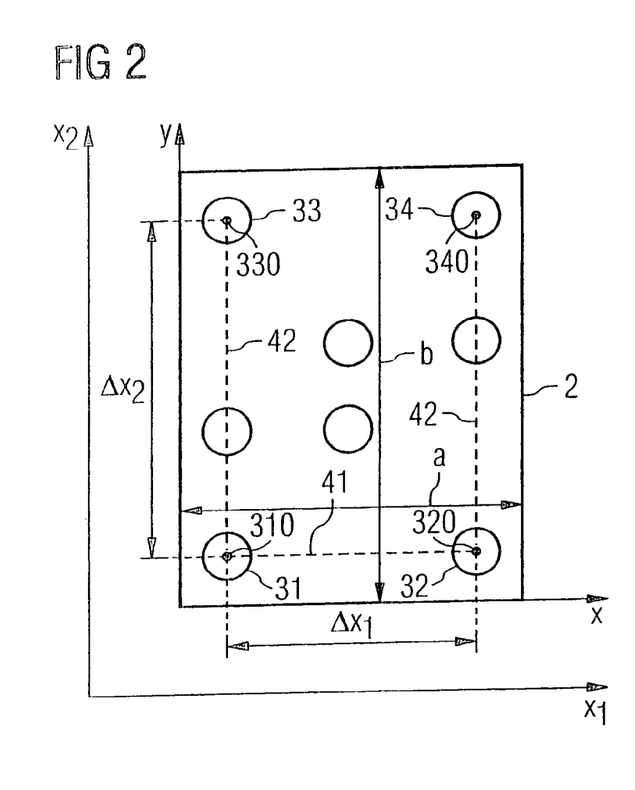
FIGS. 2 and 3, the plan view, in each case, of a lower surface of a chip with a bump arrangement.
Figure 3:
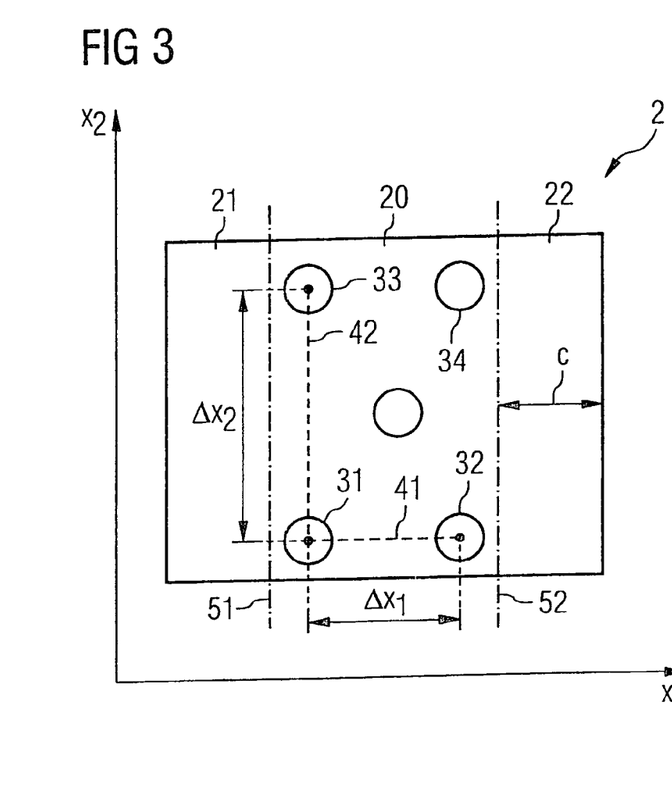

FIGS. 2-12 show the bottom side of a chip 2 with the novel arrangement of the bumps. The bumps are represented by circles. The terminally situated bumps are labeled with reference numbers 31 34. In FIGS. 3 7, the subdivision of the lower chip surface into several areas is represented by means of dashed lines 51 and 52.

Axis x is oriented along a first chip edge. Axis y is oriented along a second chip edge. First preferred direction $x_1$ is oriented parallel to axis x in the variants according to FIGS. 2-10. Second preferred direction $x_2$ is oriented parallel to axis y. Thus, the first chip edge is oriented parallel to direction $x_1$ and the second chip edge is oriented parallel to direction $x_2$.

The terminally situated bumps 31, 32 in first preferred direction $x_1$ are spaced apart from one another by the amount $\Delta x_1$. The terminally situated bumps in the second direction $x_2$ (31 and 33 in FIGS. 2, 3, 5, 6, 8, 10 or 33 and 34 in FIGS. 4, 7, 9) are spaced apart from one another by distance $\Delta x_2$. The distance between the bumps is measured between bump centers 310, 320, 330, 340 of bumps 31, 32, 33, 34.

First connecting line 41, connecting the centers of the terminally situated bumps 31, 32 (or 33, 34) in direction $x_1$, is directed parallel to direction $x_1$ in FIGS. 2 and 3. Second connecting line 42, connecting the centers of terminally situated bumps 31, 33 (or 32, 34) in direction $x_2$, is directed parallel to the direction $x_2$ in these figures. This means that the corresponding terminally situated bumps are arranged in rows running parallel to the respective direction $x_1$ or $x_2$.

Figure 9:
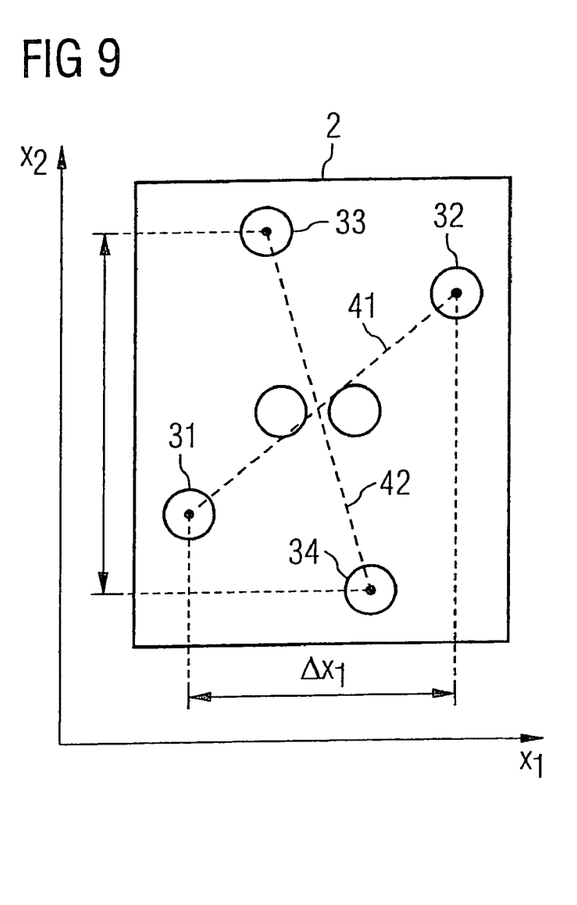
FIG. 9, the plan view of the lower surface of a chip in which the terminal bumps in one direction do not form bump rows in this direction.
Figure 11:
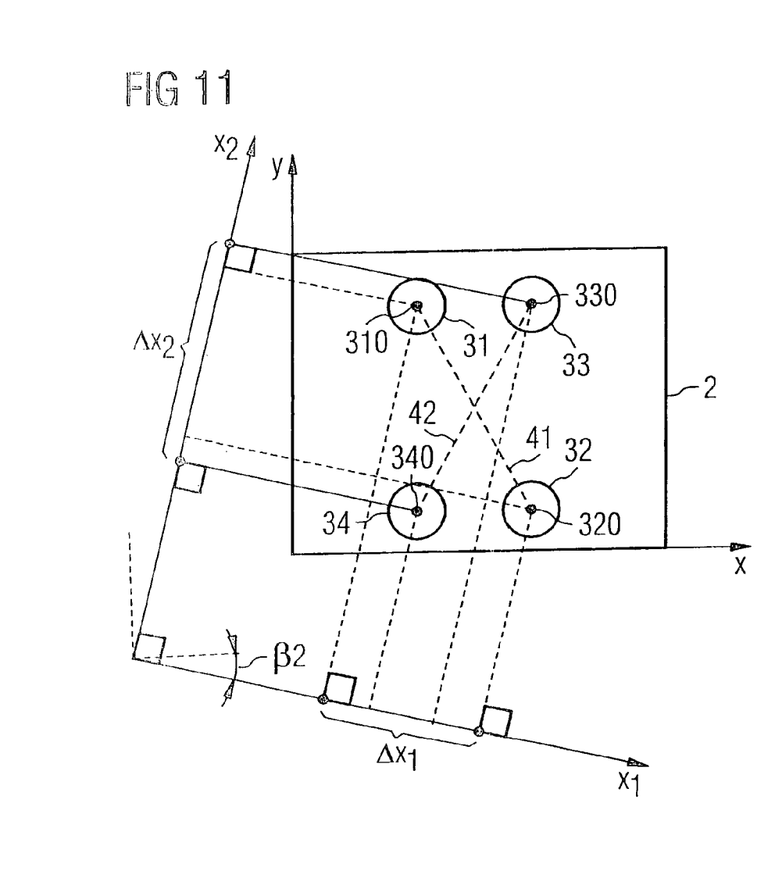
FIGS. 11, 12, the projection, in each case, of the bump centers onto axes $x_1$, $x_2$ for a rectangular coordinate system (FIG. 8) and an oblique-angled coordinate system (FIG. 9) $\{x_1, x_2\}$.
Figure 12:
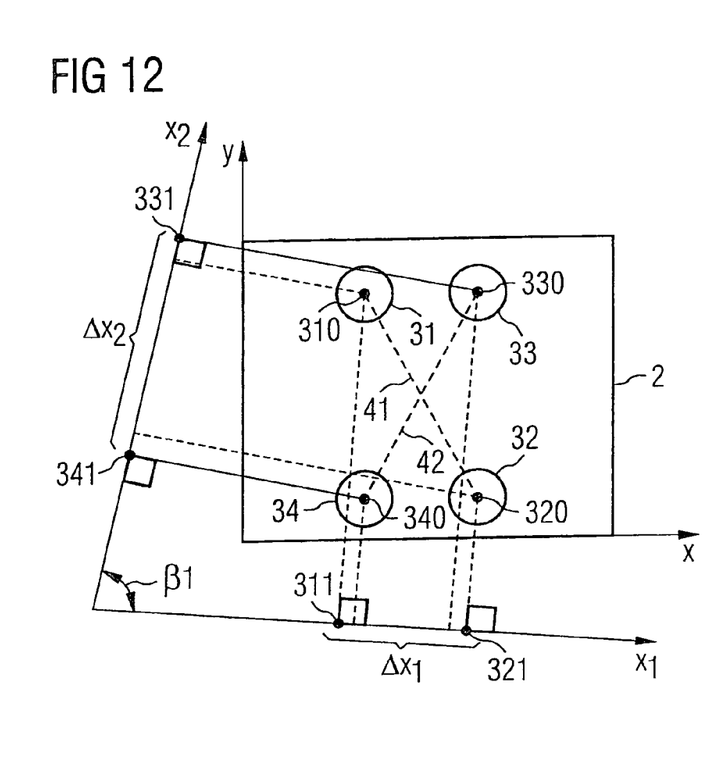

In the general case, e.g., in the variant according to FIG. 9, the terminally situated bumps in direction $x_1$ or $x_2$ are not arranged in rows relative to these directions. Connecting lines 41, 42 between the bumps do not run parallel to the preferred directions here. In this case, as shown in FIGS. 11 and 12, bump centers 310, 320, 330, 340 are mapped perpendicularly onto the respective preferred directions $x_1$ and $x_2$. The projection rays run perpendicular to the respective preferred direction. The points that correspond to the images of the bump centers on the respective axis are labeled with reference numbers 311, 321, 331, 341. The outermost imaged points (e.g., 311 and 321 in direction $x_1$ and 331, 341 in direction $x_2$) correspond to the terminally situated bumps in this direction.

In FIGS. 2, 3 and 5 the terminally situated bumps 31, 32 in direction $x_1$ are arranged parallel to the first chip edge. In FIGS. 2 and 3, terminally situated bumps 31 and 32 in direction $x_1$ are arranged along a line parallel to the chip edge in the peripheral area running along the chip edge.

The projections of points 31 and 33 (or 32 and 34) onto axis $x_1$ agree with one another in FIGS. 2, 3, 5. The projections of points 31 and 32 (or 33 and 34) onto axis $x_2$ also agree with one another. Therefore, in FIGS. 2, 3 and 5, all four bumps 31-34 are terminally situated in each direction $x_1$, $x_2$.

In the variant shown in FIG. 7, terminally situated bumps 31, 32 are not arranged in an outer row as in FIGS. 2, 3, and 5, but in the central row running parallel to the first edge, or in direction $x_1$. The projections onto axis $x_1$ of the bumps arranged in the outer rows here lie between the projections of the bumps arranged in the central row onto this axis. The distance between bumps 31, 32 arranged in the central row is thus greater that the distance between bumps arranged in the outer rows. Therefore, bumps 31, 32 form the terminally situated bumps in direction $x_1$. Since bumps 31, 32 do not lie in an outer row relative to direction $x_1$, they are not terminally situated in direction $x_2$.

In the variants according to FIGS. 2-10, first expansion difference $\Delta\alpha_1$ is greater than second expansion difference $\Delta\alpha_2$. Accordingly, the $\Delta x_1$ in direction $x_1$ of the larger expansion difference is selected to be less than distance $\Delta x_2$ in the direction of the smaller expansion difference. The lower chip surface is subdivided along direction $x_1$ in FIGS. 3, 5 and 7 into a central area 20 with bumps arranged therein and two wide peripheral areas 21, 22 without bumps.

In FIGS. 5 and 7, the bumps are arranged in three rows with two bumps each, with the rows running parallel to the first chip edge, or to direction $x_1$. The distance, measured between the bump centers, between the two outer rows corresponds to difference $\Delta x_2$. In FIG. 6, the bumps are arranged in three rows with two bumps each, the rows running parallel to the second chip edge, or to direction $x_2$. The distance between the outer two rows, measured between the bump centers, corresponds in FIG. 6 to distance $\Delta x_1$.

The cross-sectional size of the chip is a in direction $x_1$ and b in direction $x_2$. In FIGS. 2 and 9, a<b; in FIG. 3, a>b; in FIGS. 4-8, a=b.

The formation of the chip with a larger cross-sectional size b in direction $x_2$ of the smaller expansion difference has the advantage that the chip surface can be utilized especially space-economically.

In FIG. 3, the chip surface is formed with a greater cross-sectional size a in direction $x_1$ of greater expansion difference $\Delta\alpha_2$. Distance $\Delta x_1$ is nevertheless selected to be small in order to keep the shearing force component in the direction small. In direction $x_1$, the chip surface is subdivided into a central area 20 and two wide peripheral areas 21 and 22. Width c of wide peripheral area 21, 22 exceeds the cross-sectional size of a bump. All bumps are arranged in central area 20. Wide peripheral areas 21, 22 have no bumps.

Figure 8:
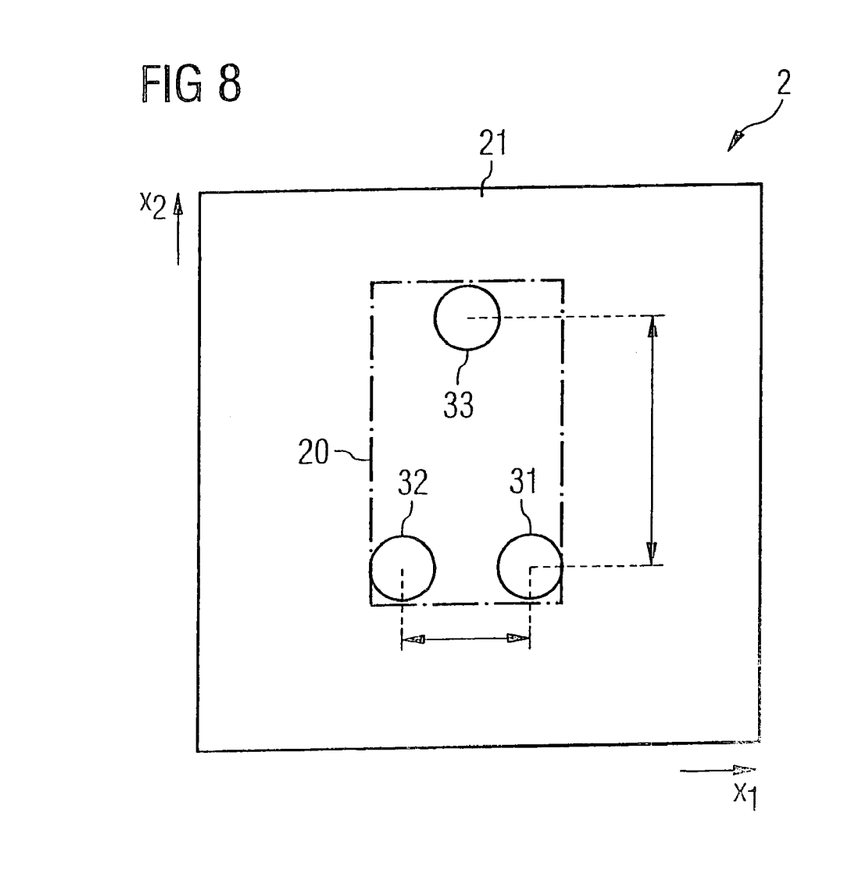
FIG. 8, the plan view of the lower surface of a chip with a wide peripheral area all around it that has no bumps.

The lower surface of chip 2 in FIG. 8 is subdivided into a central area 20 and wide peripheral area 21 running completely around. Chip 2 has no bumps in wide peripheral area 21. All bumps 31-33 are arranged in central area 20 of the lower chip surface. The width of wide peripheral area 21 here is greater in direction $x_1$ than in direction $x_2$. The width of wide peripheral area 21 in direction $x_2$ exceeds the simple cross-sectional size of a bump and is essentially equal to twice the cross-sectional size of a bump. The width of wide peripheral area 21 in direction $x_1$ markedly exceeds the cross-sectional size of a bump. In this example, $\Delta\alpha_1 > \Delta\alpha_2$. Therefore, distance $\Delta x_1$ between terminally situated bumps 31, 32 in direction $x_1$ is greater than distance $\Delta x_2$ between terminally situated bumps 31, 33 in direction $x_2$.

Figure 10:
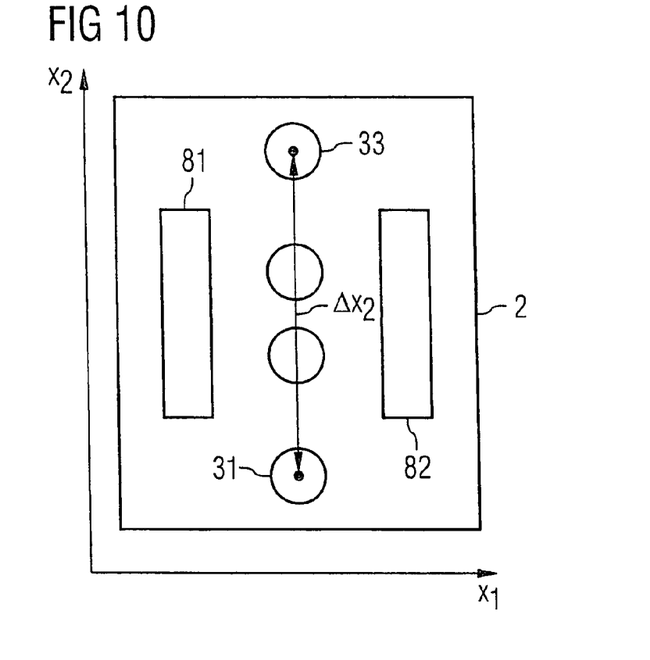
FIG. 10, the plan view of the lower surface of a chip with a bump arrangement.

In FIG. 10, an embodiment in which $\Delta\alpha_2=0$ and $\Delta\alpha_1>0$ is shown. All bumps are arranged in a single row running parallel to second preferred direction $x_2$, so that $\Delta x_1=0$. The bump row is arranged centrally relative to direction $x_1$ on the lower surface of the chip. The chip is stabilized in direction $x_1$ with respect to the chip surface by spacers 81, 82 such that the lower surface of the chip runs parallel to the upper surface of the carrier substrate. Spacers 81, 82 are arranged along first preferred direction $x_1$ in the peripheral areas of the chip. In one variant, spacers 81, 82 can be permanently connected either to the chip or to the carrier substrate. Spacers 81, 82 can be permanently connected to both the chip and the carrier substrate in another variant.

The position of the bump row relative to direction $x_1$ can also be shifted away from the center toward the second chip edge.

It is shown in FIG. 11 that the $\{x_1, x_2\}$ coordinate system is rotated by an angle $\beta 2$ relative to the $\{x, y\}$ coordinate system defined by the chip. FIG. 12 shows a chip with anisotropic properties regarding its thermal expansion behavior, wherein the directions $x_1, x_2$ of maximum and minimum expansions are not perpendicular to one another, but rather form an angle $\beta 1 < 90°$. Axes $x_1, x_2$ run at an acute angle to the chip edges.

Figure 13:
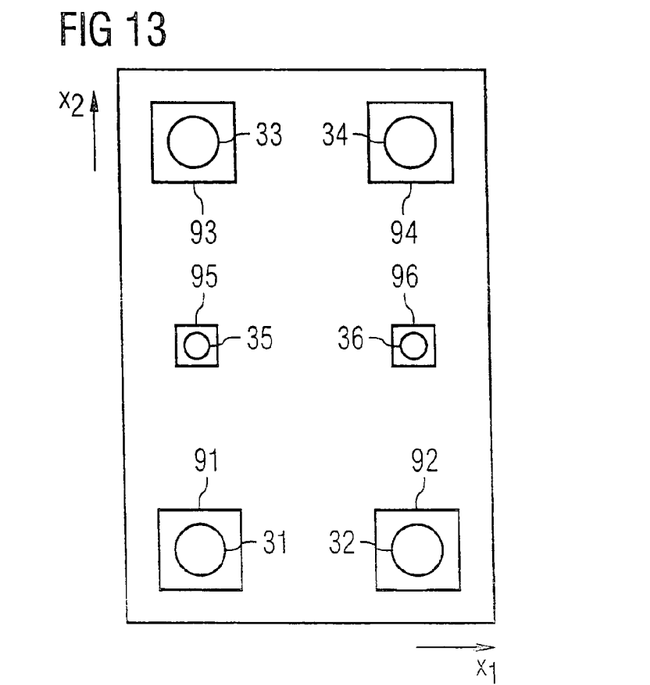
FIG. 13, the plan view of the lower surface of a chip with differently large contact surfaces that are assigned to the terminal and other bumps.

FIG. 13 shows an an embodiment, in which different-sized contact surfaces are provided on the lower chip surface for the terminally situated bumps 31-34 and for the others 35, 36. Larger contact surfaces 91-94 are assigned to terminally situated bumps 31-34, which are more severely stressed, while smaller contact surfaces 95, 96 are assigned to the other, less stressed bumps 35, 36 of the component.

Corresponding, different-sized contact surfaces opposing the contact surfaces of the chip are provided for the different types of bumps on the carrier substrate (not shown here). The bumps are permanently joined to the contact surfaces of the chip and the carrier substrate.

The invention is not limited to the above-presented embodiments, specific materials or the number of illustrated elements.

The invention claimed is:

1. A component comprising:
   a carrier substrate having a coefficient of thermal expansion $\alpha_p$, and
   a chip mounted on the carrier substrate by a plurality of bumps,
   wherein:
   the chip has a first coefficient of thermal expansion $\alpha_1$ in a first direction $x_1$ and a first expansion difference, $\Delta\alpha_1$, is equal to the absolute value of $\alpha_p - \alpha_1$,
   the chip has a second coefficient of thermal expansion $\alpha_2$ in a second direction $x_2$ and a second expansion difference, $\Delta\alpha_2$, is equal to the absolute value of $\alpha_p - \alpha_2$, with $\Delta\alpha_1$ in direction $x_1$ being greater than $\Delta\alpha_2$ in direction $x_2$, and
   the bumps are arranged such that a first distance, $\Delta x_1$, corresponding to a normal projection of a line between centers of terminally situated bumps in the first direction onto an axis running parallel to direction $x_1$ is less than a second distance $\Delta x_2$ corresponding to a normal projection of a line between centers of terminally situated bumps in the second direction onto an axis parallel to direction $x_2$, and
   wherein the carrier substrate comprises a material in which $\alpha_1 \geq \alpha_p \geq \alpha_2$.

2. The component of claim 1, wherein at least two bumps of the plurality of bumps are arranged in a line along the first direction, $x_1$.

3. The component of claim 1, wherein at least two bumps of the plurality of bumps are arranged in a line along the second direction, $x_2$.

4. The component of claim 1, wherein a lower surface of the chip includes a central area and peripheral areas, a width of each of the peripheral areas is greater than the cross-sectional size of a bumps and the chip has no bumps in the peripheral areas.

5. The component of claim 4, wherein the width of the peripheral area is at least about two times a cross-sectional size of a bump.

6. The component of claim 1, wherein:
   the chip includes a central area and peripheral areas in the first direction, and
   a width of a peripheral area is greater than the cross-sectional size of a bump and the chip has no bumps in the peripheral areas.

7. The component of claim 1, further comprising:
   a first set of contact surfaces on a lower surface of the chip and connected to the terminally situated bumps, the contact surfaces included in the first set of contact surfaces having a first size; and
   a second set of contact surfaces on the lower surface of the chip and connected to the non-terminally situated bumps, the contact surfaces included in the second set of contact surfaces having a second size that is less than the first size.

8. The component of claim 1, wherein the chip is mounted on the carrier substrate with a flip chip construction.

9. The component of claim 1, wherein the carrier substrate includes a base material having a coefficient of thermal expansion and an admixed filler having a coefficient of thermal expansion, and the coefficient of thermal expansion of the admixed filler is greater than the coefficient of thermal expansion of the base material.

10. A component comprising:
    a carrier substrate having a coefficient of thermal expansion $\alpha_p$, and
    a chip mounted on the carrier substrate by a plurality of bumps,
    wherein:
    the chip has a first coefficient of thermal expansion $\alpha_1$ in a first direction $x_1$ and a first expansion difference, $\Delta\alpha_1$, is equal to the absolute value of $\alpha_p - \alpha_1$,
    the chip has a second coefficient of thermal expansion $\alpha_2$ in a second direction $x_2$ and a second expansion difference, $\Delta\alpha_2$, is equal to the absolute value of $\alpha_p - \alpha_2$, with $\Delta\alpha_1$ in direction $x_1$ being greater than $\Delta\alpha_2$ in direction $x_2$, and
    the bumps are arranged such that a first distance, $\Delta x_1$, corresponding to a normal projection of a line between centers of terminally situated bumps in the first direction onto an axis running parallel to direction $x_1$ is less than a second distance $\Delta x_2$ corresponding to a normal projection of a line between centers of terminally situated bumps in the second direction onto an axis parallel to direction $x_2$, and
    wherein $\Delta\alpha_2$ is equal to zero and $\Delta\alpha_1$ is greater than zero.

11. The component of claim 10, wherein the bumps are arranged in a single row along the second direction $x_2$, so that $\Delta x_1 = 0$.

12. The component of claim 11, wherein the single row is on a lower surface of the chip centrally relative to direction $x_1$.

13. The component of claim 11, wherein the chip is stabilized relative to the carrier substrate in the first direction such that the lower surface of chip is essentially parallel to an upper side of the carrier substrate.

14. The component of claim 13, further comprising spacers between the chip and the carrier substrate.

15. The component of claim 14, wherein the spacers are along the first direction $x_1$ in peripheral areas of the chip.

16. The component of claim 10, wherein the carrier substrate comprises a material in which $\alpha_1 \geq \alpha_p \geq \alpha_2$.

17. The component of claim 16, wherein the carrier substrate includes a base material having a coefficient of thermal expansion and an admixed filler having a coefficient of thermal expansion, and the coefficient of thermal expansion of the admixed filler is greater than the coefficient of thermal expansion of the base material.

18. The component of claim 10, wherein a lower surface of the chip includes a central area and peripheral areas, a width of each of the peripheral areas is greater than the cross-sectional size of a bump, and the chip has no bumps in the peripheral areas.

19. The component of claim 18, wherein the width of the peripheral area is at least about two times a cross-sectional size of a bump.

20. The component of claim 10, wherein:
the chip includes a central area and peripheral areas in the first direction,
a width of a peripheral area is greater than the cross-sectional size of a bump and the chip has no bumps in the peripheral areas.

* * * * *

UNITED STATES PATENT AND TRADEMARK OFFICE
CERTIFICATE OF CORRECTION

PATENT NO. : 7,518,249 B2
APPLICATION NO. : 11/659146
DATED : April 14, 2009
INVENTOR(S) : Hans Krueger Page 1 of 1

It is certified that error appears in the above-identified patent and that said Letters Patent is hereby corrected as shown below:

Cover page, Item (57) col. 2, ABSTRACT, line 8, delete "$\alpha_p$-$\alpha_2$,I" and insert -- $\alpha_p$-$\alpha_2$. --.

Col. 8, Claim 4, line 10, delete "bumps" and insert -- bump, --.

Col. 8, Claim 10, line 42, delete "$\alpha_p$,and" and insert -- $\alpha_p$, and --.

Col. 8, Claim 10, line 51, after "value" insert -- of --.

Signed and Sealed this

Sixteenth Day of June, 2009

JOHN DOLL
*Acting Director of the United States Patent and Trademark Office*